United States Patent [19]

Kagami

[11] Patent Number: 5,091,884

[45] Date of Patent: Feb. 25, 1992

[54] SEMICONDUCTOR MEMORY DEVICE WITH IMPROVED ADDRESS DISCRIMINATING CIRCUIT FOR DISCRIMINATING AN ADDRESS ASSIGNED DEFECTIVE MEMORY CELL REPLACED WITH REDUNDANT MEMORY CELL

[75] Inventor: Akihiko Kagami, Tokyo, Japan

[73] Assignee: NEC Corporation, Tokyo, Japan

[21] Appl. No.: 543,509

[22] Filed: Jun. 26, 1990

[30] Foreign Application Priority Data

Jun. 26, 1989 [JP] Japan .................. 1-163520

[51] Int. Cl.$^5$ .............................. G11C 7/00
[52] U.S. Cl. .................... 365/200; 365/201
[58] Field of Search ............ 365/200, 201; 371/10.1, 371/10.2, 10.3, 21.6, 29.1, 21.1, 21.2, 21.3

[56] References Cited

U.S. PATENT DOCUMENTS 4,573,146 2/1986 Graham et al. ................ 365/201
4,641,310 2/1987 Mortens et al. ................ 371/21.6
5,034,923 7/1991 Kuo et al. ...................... 365/200

OTHER PUBLICATIONS

Lucy, R. F. et al., "Memory Array Failure Pattern Recognition", IBM Technical Disclosure Bulletin, vol. 20, No. 10, Mar. 1978, pp. 3938-3939.

Primary Examiner—Joseph A. Popek
Assistant Examiner—Jack A. Lane
Attorney, Agent, or Firm—Sughrue, Mion, Zinn, Macpeak & Seas

[57] ABSTRACT

For accelerating of a testing operation to determine which memory cell in a memory cell array is replaced with a redundant memory cell, a semiconductor memory device is composed of an address discriminating facility having an activation circuit operative to compare an address indicated by an address signal and the address assigned the memory cell replaced with the redundant memory cell for producing a first controlling signal. A testing operation controlling circuit is responsive to a test mode signal for producing a second controlling signal and a data write-in circuit responsive to the second controlling signal and producing a test bit of logic "1" level and a test bit of logic "0" level. The test bit of logic "1" and the test bit of logic "0" are respectively written into the redundant memory cell and the memory cell array so that an address assigned to the memory cell replaced with the redundant memory cell is discriminated through a read-out operation.

5 Claims, 4 Drawing Sheets

SEMICONDUCTOR MEMORY DEVICE WITH IMPROVED ADDRESS DISCRIMINATING CIRCUIT FOR DISCRIMINATING AN ADDRESS ASSIGNED DEFECTIVE MEMORY CELL REPLACED WITH REDUNDANT MEMORY CELL

FIELD OF THE INVENTION

This invention relates to a semiconductor memory device and, more particularly, to an address discriminating circuit for deciding whether or not an address supplied thereto has been assigned a defective memory cell replaced with a redundant memory cell.

DESCRIPTION OF THE RELATED ART

The dimensions of a miniaturized component transistor allow a semiconductor memory device to increase the integration density, and the high integration semiconductor memory device tends to be objected as an inferior product due to, for example, a small crystal defect or contaminant. A redundant technology is applied to the semiconductor memory device for saving the inferior product, and a modern semiconductor memory device has redundant memory cells replaceable with defective memory cells. However, such a semiconductor memory device equipped with the redundant memory cells is usually subjected to an examination to determine which memory cells are the defective memory cell and replaced with the redundant memory cells. For this reason, an address discriminating circuit is incorporated in the semiconductor memory device.

Figure 1:
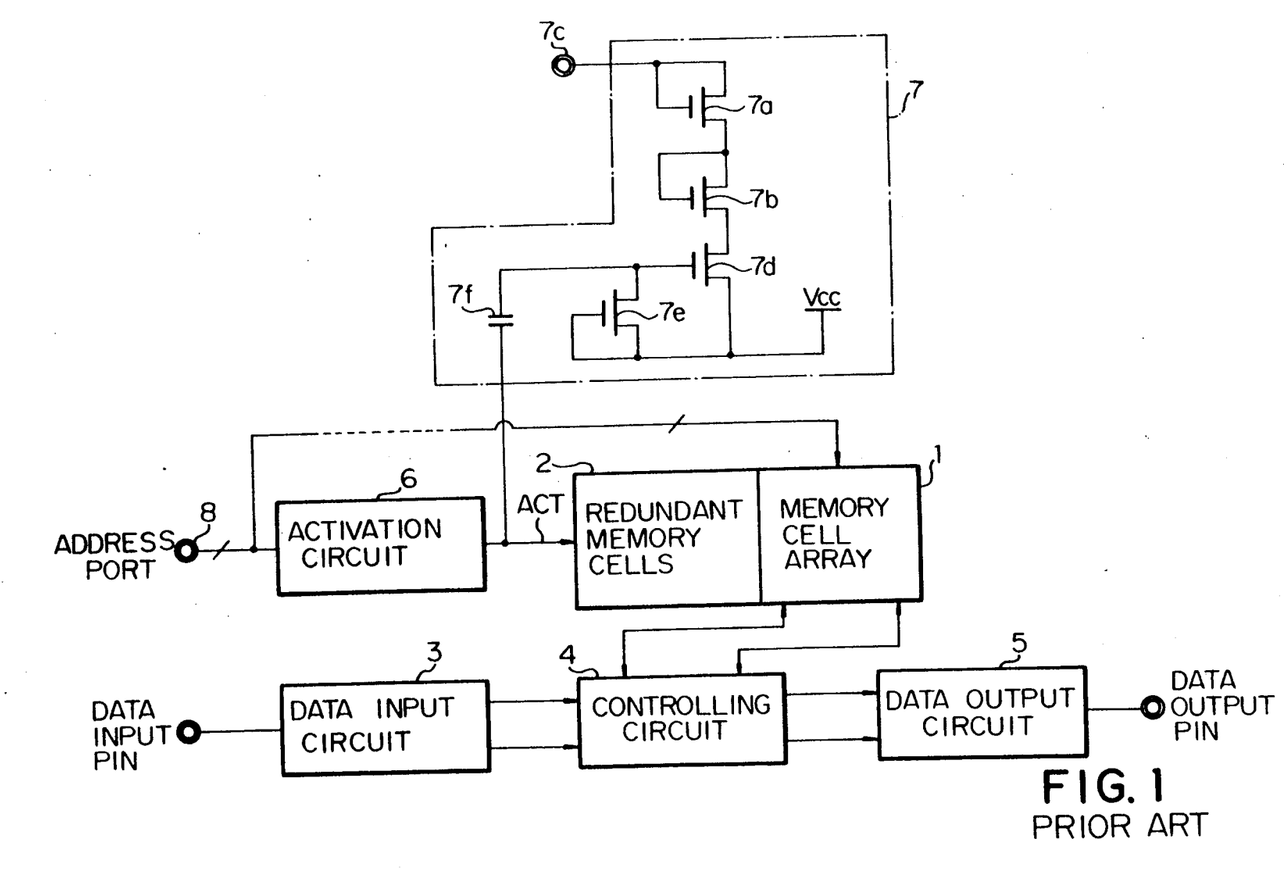
FIG. 1 is a circuit diagram showing the arrangement of the prior art semiconductor memory device with the address discriminating circuit.

FIG. 1 shows a prior art semiconductor memory device and comprises a memory cell array 1, and defective memory cells of the memory cell array 1 are replaced with redundant memory cells 2, if any. A data input circuit 3, a data controlling circuit 4 and a data output circuit 5 are provided in association with the memory cell array 1 and the redundant memory cells 2 for a data bit written therein or read out therefrom, and an activation circuit 6 activates the redundant memory cells 2 upon accessing the defective memory cells replaced with the redundant memory cells 2. An address discriminating circuit 7 is coupled to the activation circuit 6 and comprises a series of load transistors 7a and 7b coupled at one end thereof to an external pin 7c, a gate transistor 7d capable of providing a current path between the series combination and a source of positive voltage level Vcc, a load transistor 7e coupled between the gate and drain electrodes of the gate transistor 7d, and a capacitor 7f coupled between the gate electrode of the gate transistor 7d and the output node of the activation circuit 6. Although the semiconductor memory device has other component circuits associated with the memory cell array 1, the illustration is restricted to the related circuits to the address discriminating circuit 7.

Assuming now that some defective memory cells are found in the memory cell array 1 and replaced with the redundant memory cells 2, the semiconductor memory device is subjected to the examination, and a multi-bit address signal is transferred from an address port 8 to the activation circuit 6 to see whether or not the address represented by the address signal is assigned the defective memory cells. If the answer is given in the negative, the multi-bit address signal is incremented to see if the address thus incremented belongs to the defective memory cells. If the activation circuit 6 finds that the new address is matched with the address assigned the defective memory cells, the activation circuit 6 shifts an activation signal ACT from a low voltage level to a high voltage level for accessing the redundant memory cells instead of the defective memory cells.

The activation signal ACT is further supplied to the capacitor 7f, and the capacitor 7f boosts the gate voltage level at the gate electrode of the gate transistor 7d beyond the positive voltage level Vcc. In this circumstances, the current path takes place in the gate transistor 7d, and a voltage level higher than the positive voltage level Vcc by at least the total threshold level of the load transistors 7a and 7b causes current to flow through the current path of the gate transistor 7d into the source of positive voltage level Vcc. If an ammeter is coupled to the external pin 7c, the current is detected by the ammeter, and the address indicated by the new address signal is assigned the defective memory cells replaced with the redundant memory cells 2. However, if no activation signal is produced by the activation circuit 6, the gate transistor remains in the off state, and, therefore, the ammeter does not detect any current.

However, a problem is encountered in the prior art semiconductor memory device in that a substantial amount of time is consumed for the examination of each address. This is because of the fact that the memory cell array is searched by measuring the amount of current to be supplied to the external pin 7c. In fact, the measurement of current consumes about 10 millisecond for each address, and, therefore, a memory cell array consisting of $2^{10}$ memory cells needs about 10 seconds by way of example.

SUMMARY OF THE INVENTION

It is therefore an important object of the present invention to provide a semiconductor memory device which is equipped with an address discriminating circuit for quickly providing information of address assigned a defective memory cell.

To accomplish the object, the present invention proposes to write a test bit in a memory cell array and redundant memory cells, and the logic level of the test bit depends upon the memory cell or the redundant memory cell.

In accordance with the present invention, there is provided a semiconductor memory device having a write-in mode, a read-out mode and a testing mode of operation, comprising: a) a memory cell array having a plurality of memory cells assigned to addresses, respectively; b) at least one redundant memory cell with which a defective memory cell of the memory cell array is replaced, if any; c) addressing means responsive to an address signal representative of an address assigned one of the memory cells and activating one of the memory cells or one of the redundant memory cells for the write-in mode or the read-out mode of operation; and d) data input-and-output means for writing an input data bit into one of the memory cells designated by the address signal or one of the redundant memory cells instead of the defective memory cell designated by the address signal, the input data bit being read out from the aforesaid one of the memory cells or the one of the redundant memory cells through the data input-and-output means as an output data bit, in which the addressing means comprise an activation circuit operative to compare an address indicated by the address signal with the address assigned the defective memory cell and to produce an activation signal upon matching between the two addresses for activating the redundant memory cell instead of the defective memory cell and a first controlling signal representative of the matching between the two addresses and in which the data input-and-output means comprise a data write-in circuit operative to transfer the input data bit of either first or second logic level in the write-in mode of operation and to supply the redundant memory cell a test bit of the first logic level in the presence of the first controlling signal regardless of the input data bit or a test bit of the second logic level on the basis of the input data bit in the absence of the first controlling signal during the testing mode of operation, the activation circuit and the data write-in circuit forming in combination address discriminating means together with a testing operation controlling circuit operative to produce a second controlling signal in the testing mode of operation for allowing the data write-in circuit to produce the test bit.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 2:
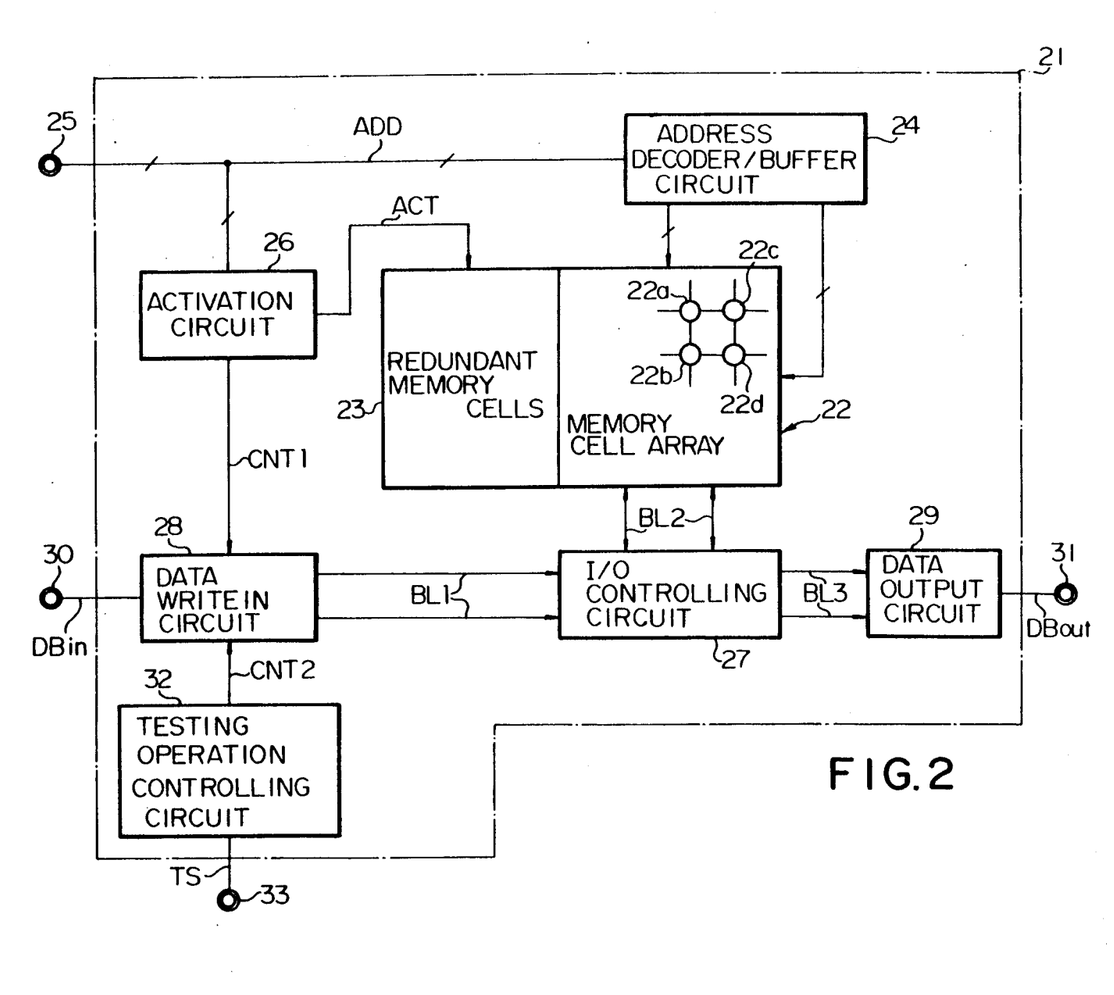
FIG. 2 is a circuit diagram showing the arrangement of a semiconductor memory device according to the present invention.

Referring first to FIG. 2 of the drawings, a semiconductor memory device embodying the present invention is fabricated on a semiconductor substrate 21 and comprises a memory cell array 22 having a plurality of memory cells arranged in rows and columns. Although a large number of memory cells are incorporated in the memory cell array 22, only four memory cells 22a, 22b, 22c and 22d are shown in FIG. 1. The memory cell array 22 is accompanied with redundant memory cells 23, and any of the rows or columns in the memory cell array 22 including a defective memory cell or cells is replaceable with the redundant memory cells 23. The semiconductor memory device has various component circuits except for those illustrated in FIG. 1, however, only component circuits related to the present invention are shown in the drawings for the sake of simplicity.

The memory cell array 22 is associated with an address decoder-and-buffer circuit 24, and a multi-bit address signal ADD is transferred from an address port 25 to the address decoder-and-buffer circuit 24. The multi-bit address signal ADD is indicative of an address assigned one of the memory cells of the memory cell array 22, and the multi-bit address signal may be supplied to the address port 25 twice for each memory cell. An activation circuit 26 is provided in association with the redundant memory cells 23 and operative to discriminate a row or column address indicated by the multi-bit address signal ADD. Namely, the activation circuit 26 memorizes at least one row or column address assigned a defective memory cell and compares an address indicated by the multi-bit address signal ADD with the address to be memorized therein. If the multi-bit address signal ADD is indicative of the row or column address assigned the defective memory cell, the activation circuit 26 activates the redundant memory cells 23 instead of the memory cells to be replaced with the redundant memory cells 23 with an activation signal ACT. The activation circuit 26 further produces a first controlling signal CNT1 of an active high voltage level when the address assigned the defective memory cell is matched with the address signal indicated by the multi-bit address signal ADD. However, the first controlling signal CNT1 remains in a low voltage level in so far as these addresses are not matched with one another. The first controlling signal CNT1 will be described hereinbelow in detail in connection with a testing mode of operation.

The memory cell array 22 as well as the redundant memory cells 23 are further associated with a data input-and-output controlling circuit 27, and the data input-and-output controlling circuit 27 is coupled to a data write-in circuit 28 as well as to a data output circuit 29. The data write-in circuit 28 in turn is coupled to a data input pin 30, and a data bit DBin fed thereto is written into one of the memory cells or one of the redundant memory cells 23 through the data input-and-output controlling circuit 27 in a write-in mode of operation. Namely, the data write-in circuit 28 produces a data bit signal and the complementary signal thereof representative of the data bit DBin, and a bit line pair BL1 propagates the data bit signal and the complementary signal thereof to the data input-and-output controlling circuit 27. Since another bit line pair BL2 is provided between the data input-and-output controlling circuit 27 and both of the memory cell array 22 and the redundant memory cells 23, the data bit signal and the complementary signal thereof are in turn transferred thereto. If, on the other hand, the semiconductor memory device enters a read-out mode of operation, a data bit DBout read out from one of the memory cells or of the redundant memory cells 23 is transferred from the data input-and-output controlling circuit 27 to the data output circuit 29 which in turn transfers the data bit DBout to a data output pin 31. Namely, the data bit DBout is read out in the form of a data bit signal and the complementary signal thereof, and the bit line pair BL2 propagates the data bit signal and the complementary signal thereof to the data input-and-output controlling circuit 27 which in turn transfers them through another bit line pair BL3 to the data output circuit 29. The data output circuit 29 retrieves the data bit DBout on the basis of the data bit signal and the complementary signal thereof, and the data bit DBout is fed to the data output pin 31. In this instance, the address decoder-and-buffer circuit 24 and the activation circuit 26 as a whole constitute addressing means, and the data input-and-output controlling circuit 27, the data write-in circuit 28 and the data output circuit 29 form in combination data input-and-output means.

The semiconductor memory device according to the present invention further comprises a testing operation controlling circuit 32 responsive to a test mode signal TS fed to a controlling pin 33. The testing operation controlling circuit 32 produces a second controlling signal CNT2 of an active high voltage level in the presence of the test mode signal TS; however, the second controlling signal CNT2 remains in the inactive low voltage level in the absence of the test mode signal TS.

Figure 3:
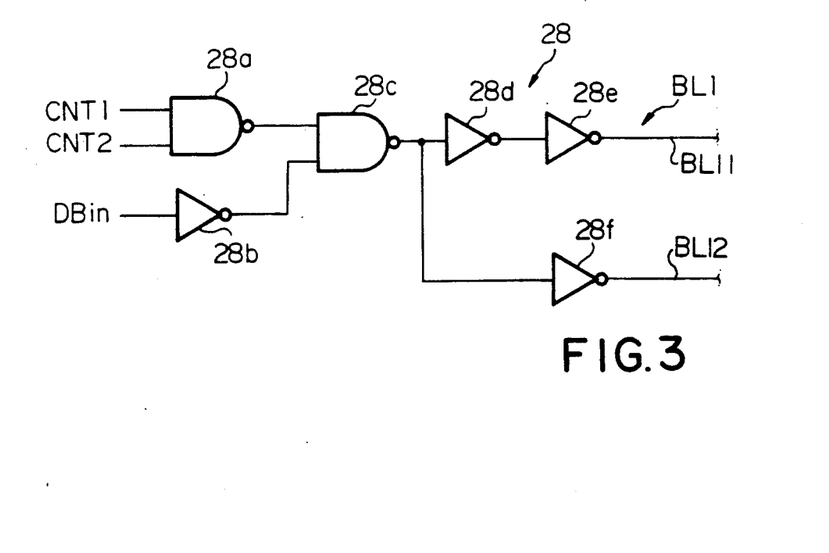
FIG. 3 is a logic diagram showing the circuit arrangement of a data write-in circuit incorporated in the semiconductor memory device shown in FIG. 2.

Turning to FIG. 3 of the drawings, the data write-in circuit 28 comprises a first NAND gate 28a supplied in parallel with the first and second controlling signals CNT1 and CNT2, a first inverter circuit 28b supplied with the input data bit DBin, a second NAND gate 28c with two input nodes coupled in parallel to the respective output nodes of the first NAND gate 28a and the first inverter circuit 28b, a series combination of second and third inverter circuits 28d and 28e coupled between the output node of the second NAND gate 28c and one of the bit line pair BL1, and a fourth inverter circuit 28f coupled between the output node of the second NAND gate 28c and the other of the bit line pair BL1.

The data write-in circuit 28 thus arranged behaves as follows. If the write-in mode of operation is established in the semiconductor memory device in the absence of the test mode signal TS, the second controlling signal CNT2 remains in the inactive low voltage level, the first NAND gate 28c produces an output signal of the active high voltage level regardless of the first controlling signal CNT1. With the output signal of the high voltage level, the second NAND gate 28c produces the complementary signal of the output signal of the first inverter circuit 28b. Since the input data bit DBin is fed to the first inverter circuit 28b, the output signal of the second NAND gate 28c is identical in the logic level with the input data bit DBin. Since the output signal of the second NAND gate 28c is propagated through the series combination of the second and third inverter circuits 28d and 28e, the input data bit DBin is supplied to one of the bit line pair BL11, and the complementary signal thereof appears on the other of the bit line pair BL12. Thus, the input data bit DBin is written into one of the memory cells or of the redundant memory cells 23 depending upon the activation signal ACT.

However, if the test mode signal TS is fed to the testing operation controlling circuit 32, the testing mode of operation is established in the semiconductor memory device, and the input data bit DBin of logic "0" level is supplied to the input data pin 30. In this instance, the logic "0" level is equivalent to the low voltage level, and, accordingly, the high voltage level is indicative of logic "1" level. In the testing mode of operation, the second controlling signal CNT2 goes up to the active high voltage level, and the output signal of the second NAND gate 28c is opposite in logic level to the first controlling signal CNT1. Namely, when the address indicated by the address signal ADD is matched with the address assigned the defective memory cell and, accordingly, the first controlling signal CNT1 goes up to the high voltage level, the second NAND gate 28c produces the output signal of the high voltage level regardless of the input data bit DBin of logic "0" level, and, accordingly, one of the bit line pair BL11 goes up to the high voltage level in the presence of a test bit of the logic "1" level. The test bit of the logic "1" level is written into one of the redundant memory cells 23 even though the input data bit DBin of the logic "0" level is fed to the input data pin 30. However, if the addresses are not matched with one another, the first controlling signal remains in the low voltage level, and the output signal of the high voltage level is fed from the first NAND gate 28a to the second NAND gate 28c. Then, the second NAND gate 28c produces the complementary signal of the output signal of the first inverter circuit 28b which is identical in the logic level with the input data bit DBin of the logic "0" level. In other words, the test bit of the logic "0" is written into all of the memory cells which are not replaced with the redundant memory cells 23. The activation circuit 26, the data write-in circuit 28 and the testing operation controlling circuit 32 form in combination address discriminating means.

In the testing mode of operation, the multi-bit address signal ADD is incremented in the presence of the input data bit DBin of the logic "0" level, but the test bit of the logic "1" is written into the redundant memory cells 23. Upon completion of the write-in operation with the input data bit of the logic "0" level, the semiconductor memory device is changed into the read out mode of operation, and the multi-bit address signal ADD is incremented so that the test bits are sequentially read out from the memory cell array 22 and the redundant memory cells 23 and transferred to the data output pin 31 as the output data bits DBout, respectively. If an address indicated by the address signal ADD is assigned a non-defective memory cell of the memory cell array 22, the logic "0" appears at the data output pin 31; however, the data bit DBout read out from the redundant memory cells 23 is of the logic "1" level.

Thus, the output data bit DBout at the data output pin 31 tells whether or not the address indicated by the address signal ADD is assigned a defective memory cell replaced with one of the redundant memory cells 23. Moreover, the activation circuit 26 is shared between the addressing means and the address discriminating means and the data write-in circuit 28 is shared between the data input-and-output means and the address discriminating means. This results in that the number of the component transistors added for formation of the address discriminating circuit is relatively small and, therefore, the semiconductor memory device can be fabricated on a small size semiconductor substrate 21. These are the attractive points of the semiconductor memory device according to the present invention.

Second Embodiment

Figure 4:
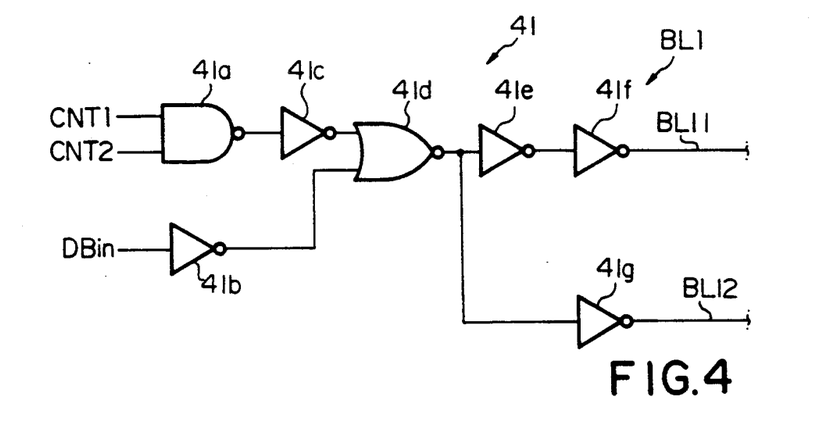
FIG. 4 is a logic diagram showing the circuit arrangement of a data write-in circuit incorporated in another semiconductor memory device according to the present invention.

Turning to FIG. 4 of the drawings, another data write-in circuit 41 is illustrated and incorporated in a semiconductor memory device embodying the present invention. The semiconductor memory device is similar to that illustrated in FIG. 3 with the exception of the data write-in circuit 41, and, for this reason, description is focused upon the data write-in circuit 41 only. Other component circuits are designated by the same reference numerals without any detailed description if necessary.

The data write-in circuit 41 comprises a third NAND gate 41a supplied in parallel with the first and second controlling signals CNT1 and CNT2, a fifth inverter circuit 41b supplied with the input data bit DBin, a sixth inverter circuit 41c coupled to the output node of the third NAND gate 41a, a NOR gate 41d coupled in parallel to the output nodes of the fifth and sixth inverter circuits 41b and 41c, a series combination of seventh and eighth inverter circuits 41e and 41f coupled to the output node of the NOR gate 41d and a ninth inverter circuit 41g coupled to the output node of the NOR gate 41d in parallel to the series combination.

The circuit behavior of the data write-in circuit 41 is similar to that of the first embodiment. Namely, the third NAND gate 41a produces an output signal of logic "1" level in so far as the second controlling signal CNT2 remains in the logic "0" level, and the NOR gate 41d is supplied from the sixth inverter circuit 41c with an output signal of the logic "0" level. With the output signal of the logic "0" level, the NOR gate 41d is activated and produces the complementary signal of the output signal fed from the fifth inverter circuit 41b. An output signal of the NOR gate 41d is identical in logic level with the input data bit DBin, and, therefore, the input data bit DBin is relayed to the bit line BL11 through the data write-in circuit 41. However, the complementary signal of the input data bit DBin is supplied from the ninth inverter circuit 41g to the other bit line BL12. Thus, the data write-in circuit 41 produces the input data signal and the complementary signal thereof on the basis of the input data bit DBin in the write-in mode of operation, and the input data signal and the complementary signal thereof are propagated by the bit line pair BL1.

If the testing mode of operation is established in the semiconductor memory device, the second controlling signal CNT2 is of the logic "1" level, and the third NAND gate 41a produces the complementary signal of the first controlling signal CNT1, but the complementary signal is inverted by the sixth inverter circuit 41c. Then, the output signal of the sixth inverter circuit 41c is identical in logic level with the first controlling signal CNT1, and, therefore, activation of the NOR gate depends on the first controlling signal CNT1. Namely, if the first controlling signal CNT1 is of the logic "0" level, the NOR gate 41d is activated to produce the output signal identical in logic level with the input data bit DBin. However, if the first controlling signal CNT1 is of the logic "1" level, the NOR gate 41d produces the output signal of the logic "0" level regardless of the input data bit DBin.

The data write-in circuit 41 thus arranged distributes a test bit of either logic level depending upon the first controlling signal CNT1. Namely, if the input data bit DBin of the logic "1" level is supplied to the input data pin 30 during the testing mode of operation, the test bit of the logic "1" is written into every memory cell except for the defective memory cells replaced with the redundant memory cells 23, but the test bit of the logic "0" level is written into each redundant memory cell. After the write-in operation, all of the test bits are sequentially read out from the memory cell array 22 and the redundant memory cells 23 by incrementing the address signal ADD, and the test bits thus read out designate the address assigned to the defective memory cell.

Third Embodiment

Figure 5:
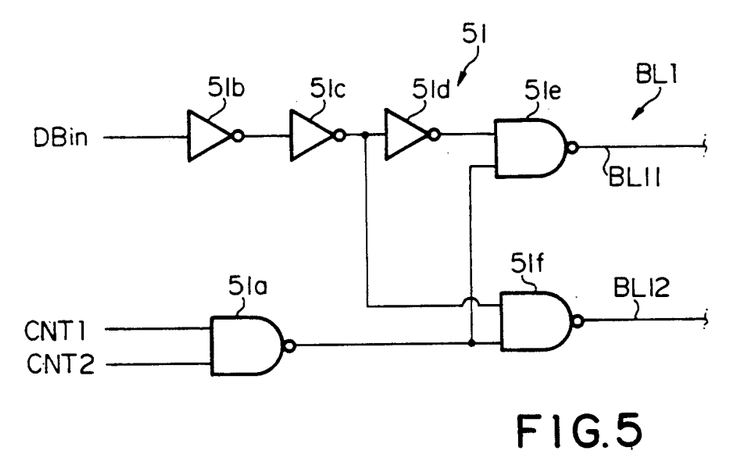
FIG. 5 is a logic diagram showing the circuit arrangement of a data write-in circuit incorporated in still another semiconductor memory device according to the present invention.

Turning to FIG. 5 of the drawings, a data write-in circuit 51 incorporated in still another semiconductor memory device embodying the present invention comprises a fourth NAND gate 51a supplied with the first and second controlling signals CNT1 and CNT2, a series combination of tenth, eleventh and twelfth inverter circuits 51b, 51c and 51d supplied with the input data bit DBin, a fifth NAND gate 51e coupled in parallel to the output nodes of the fourth NAND gate 51a and the twelfth inverter circuit 51d, and a sixth NAND gate 51f coupled in parallel to the output nodes of the fourth NAND gate 51a and the eleventh inverter circuit 51c. The other component circuits are similar to those of the first embodiment, and no description is incorporated hereinbelow for the sake of simplicity.

The data write-in circuit 51 behaves as similar to the data write-in circuit 28. Namely, the second controlling signal CNT2 allows the fourth NAND gate 51a to produce the output signal of the logic "1" level regardless of the first controlling signal CNT1, and the output signal of the logic "1" level activates both of the fifth and sixth NAND gates 51e and 51f. The eleventh inverter circuit 51c produces an output signal identical in logic level with the input data bit DBin, but the twelfth inverter circuit 51d produces an output signal opposite in logic level to the input data bit DBin. Since the fifth and sixth NAND gates 51e and 51f behave as inverter circuits in the presence of the output signal of the logic "1" level fed from the fourth NAND gate 51a, the fifth NAND gate 51e supplies the bit line BL11 an output signal identical in logic level with the input data bit DBin, and the sixth NAND gate 51f provides the complementary signal to the bit line BL12. Thus, the data write-in circuit 51 relays the input data bit DBin in the absence of the test mode signal TS.

However, if the second controlling signal CNT2 is changed to the logic "1" level in the presence of the test mode signal TS, the fourth NAND gate 51a is activated and serves as an inverter circuit for the first controlling signal CNT1. In this situation, the fourth NAND gate 51a produces the output signal of the logic "0" level on the basis of the first controlling signal CNT1 of the logic "1" level, and the output signal of the logic "0" level deactivates the fifth and sixth NAND gates 51e and 51f. Then, the bit lines BL11 and BL12 are supplied with the output signals of the logic "1" level, and no data bit is written in either memory cell array 22 or redundant memory cells 23. However, if the first controlling signal CNT1 is of the logic "0" level, the fifth and sixth NAND gates 51e and 51f are responsive to the input data bit DBin for providing a test bit to the memory cell array 22.

With the data write-in circuit 51, the examination is carried out as follows: First, test bits of logic "1" level are written into all of the memory cells and the redundant memory cells 23. Then, the testing mode of operation is established in the semiconductor memory device, and the input data bit DBin of the logic "0" level is fed to the input data pin 30 during the testing mode of operation. If the address signal ADD designates an address assigned to a defective memory cell replaced with the redundant memory cell 23, the first controlling signal CNT1 is of the logic "1" level, and no write-in operation is carried out for the redundant memory cell 23. However, the input data bit DBin of the logic "1" level is written into the non-defective memory cells during the testing mode of operation. Thus, the test bits written into the redundant memory cells 23 are different in logic level from those written into the non-defective memory cells, and, for this reason, the address assigned the defective memory cell is discriminated by monitoring the logic level at the output data pin 31.

Although particular embodiments of the present invention have been shown and described, it will be obvious to those skilled in the art that various changes and modifications may be made without departing from the spirit and scope of the present invention. For example, the present invention is applicable to a semiconductor memory device having redundant memory cells with which a plurality of rows and a plurality of columns in the memory cell array are replaced.

What is claimed is:

1. A semiconductor memory device having a write-in mode, a read-out mode and a testing mode of operation, comprising:
   a) a memory cell array having a plurality of memory cells assigned to addresses, respectively;
   b) a plurality of redundant memory cells, a defective memory cell of said memory cell array being replaced with one of said redundant memory cells, said defective memory cell having an address;
   c) addressing means, responsive to an address signal representative of an address assigned to one of said memory cells for activating said one of said memory cells or one of said redundant memory cells for said write-in mode or said read-out mode of operation; and
   d) data input-and-output means operative to write a write-in data bit, corresponding to an input data bit, into said one memory cell activated by said addressing means, when said one memory cell is not replaced with said one redundant memory cell, said data input-and-output means being further operative to write a predetermined data bit into said one redundant memory cell activated by said addressing means, independent of said input data bit.

2. A semiconductor memory device having a write-in mode, a read-out mode and a testing mode of operation, comprising:
   a) a memory cell array having a plurality of memory cells assigned to addresses, respectively;
   b) a plurality of redundant memory cells, any defective memory cell of said memory cell array being replaced with one of said redundant memory cells, said defective memory cells having an address;
   c) addressing means, responsive to an address signal representative of an address assigned to one of said memory cells, for activating one of said memory cells or one of said redundant memory cells for said write-in mode or said read-out mode of operation; and
   d) data input-and-output means for writing an input data bit into one of said memory cells designated by said address signal or one of said redundant memory cells instead of said defective memory cell designated by said address signal, said input data but being read out from said one of said memory cells or said one of said redundant memory cells through said data input-and-output means as an output data bit, in which said addressing means comprises an activation circuit operative to compare an address indicated by said address signal with said address assigned to said defective memory cell and to produce an activation signal upon making a decision that said address indicated by said address signal is matched with said address assigned said defective memory cell for activating said redundant memory cell instead of said defective memory cell, said activation circuit further producing a first controlling signal indicative of said decision, and in which said data input-and-output means comprises a data write-in circuit operative to transfer said input data bit of either first or second logic level in said write-in mode of operation, said write-in circuit being further operative to supply said one of said redundant memory cells a test bit of said first logic level when said first controlling signal is produced in said testing mode of operation, said write-in circuit being further operative to supply a test bit corresponding to said input data bit to said one of said memory cells when said first controlling signal is not produced in said testing mode of operation, said test bit of said first logic level and said test bit corresponding to said input data bit being used in a testing operation, said activation circuit and said data write-in circuit forming in combination address discriminating means together with a testing operation controlling circuit operative to produce a second controlling signal in said testing mode of operation for causing said data write-in circuit to produce said test bit, said data write-in circuit comprising a first NAND gate supplied with said first and second controlling signals, a first inverter circuit supplied with said input data bit, a second NAND gate supplied with output signals of said first NAND gate and said first inverter circuit, a series combination of second and third inverter circuits coupled to an output node of said second NAND gate and a fourth inverter circuit coupled to an output node of said second NAND gate in parallel to said series combination.

3. A semiconductor memory device having a write-in mode, a read-out mode and a testing mode of operation, comprising:
   a) a memory cell array having a plurality of memory cells assigned to addresses, respectively;
   b) a plurality of redundant memory cells, any defective memory cell of said memory cell array being replaced with one of said redundant memory cells, said defective memory cell having an address;
   c) addressing means, responsive to an address signal representative of an address assigned to one of said memory cells, for activating one of said memory cells or one of said redundant memory cells for said write-in mode or said read-out mode of operation; and
   d) data input-and-output means for writing an input data bit into one of said memory cells designated by said address signal or one of said redundant memory cells instead of said defective memory cell designated by said address signal, said input data bit being read out from said one of said memory cells or said one of said redundant memory cells through said data input-and-output means as an output data bit, in which said addressing means comprise an activation circuit operative to compare an address indicated by said address signal with said address assigned to said defective memory cell and to produce an activation signal upon making a decision that said address indicated by said address signal is matched with said address assigned said defective memory cell for activating said redundant memory cell instead of said defective memory cell, said activation circuit further producing a first controlling signal indicative of said decision, and in which said data input-and-output means comprises a data write-in circuit operative to transfer said input data bit of either first or second logic level in said write-in mode of operation, said write-in circuit being further operative to supply said one of said redundant memory cells a test bit of said first logic level when said first controlling signal is produced in said testing mode of operation, said write-in circuit being further operative to supply a test bit corresponding to said input data bit to said one of said memory cells when said first controlling signal is not produced in said testing mode of operation, said test bit of said first logic level and said test bit corresponding to said input data bit being used in a testing operation, said activation circuit and said data write-in circuit forming in combination address discriminating means together with a testing operation controlling circuit operative to produce a second controlling signal in said testing mode of operation for causing said data write-in circuit to produce said test bit, said data write-in circuit comprises a NAND gate supplied with said first and second controlling signals, a first inverter circuit supplied with said input data bit, a second inverter circuit coupled to an output node of said NAND gate, a NOR gate coupled in parallel to output nodes of said first and second inverter circuits, a series combination of third and fourth inverter circuits coupled to an output node of said NOR gate, and a fifth inverter circuit coupled to the output node of the NOR gate in parallel with the series combination of said third and fourth inverter circuits.

4. A semiconductor memory device having a write-in mode, a read-out mode and a testing mode of operation, comprising:
 a) a memory cell array having a plurality of memory cells assigned to addresses, respectively;
 b) a plurality of redundant memory cells, any defective memory cell of said memory cell array being replaced with one of said redundant memory cells, said defective memory cell having an address;
 c) addressing means, responsive to an address signal representative of an address assigned to one of said memory cells, for activating one of said memory cells or more of said redundant memory cells for said write-in mode or said read-out mode of operation; and
 d) data input-and-output means for writing an input data bit into one of said memory cells designated by said address signal or one of said redundant memory cells instead of said defective memory cell designated by said address signal, said input data bit being read out from said one of said memory cells or said one of said redundant memory cells through said data input-and-output means as an output data bit, in which said addressing means comprise an activation circuit operative to compare an address indicated by said address signal with said address assigned to said defective memory cell and to produce an activation signal upon making a decision that said address indicated by said address signal is matched with said address assigned said defective memory cell for activating said redundant memory cell instead of said defective memory cell, said activation circuit further producing a first controlling signal indicative of said decision, and in which said data input-and-output means comprise a data write-in circuit operative to transfer said input data bit of either first or second logic level in said write-in mode of operation, said write-in circuit being further operative to supply said one of said redundant memory cells a test bit of said first logic level when said first controlling signal is produced in said testing mode of operation, said write-in circuit being further operative to supply a test bit corresponding to said input data bit to said one of said memory cells when said first controlling signal is not produced in said testing mode of operation, said test bit of said first logic level and said test bit corresponding to said input data bit being used in a testing operation, said activation circuit and said data write-in circuit forming in combination address discriminating means together with a testing operation controlling circuit operative to produce a second controlling signal in said testing mode of operation for causing said data write-in circuit to produce said test bit, said data write-in circuit comprises a first NAND gate supplied with said first and second controlling signals, a series combination of first, second and third inverter circuits supplied with said input data bit, a second NAND gate coupled in parallel to the output nodes of said first NAND gate and said third invert circuit, and a third NAND gate coupled in parallel to output nodes of said first NAND gate and said second inverter circuit.

5. The semiconductor memory device of claim 1, wherein said data input-and-output means writes said predetermined data bit into said one redundant memory cell during a testing mode so that an address assigned a defective memory cell can be determined by reading said predetermined data bit.

* * * * *